US006624053B2

(12) United States Patent
Passemard

(10) Patent No.: US 6,624,053 B2
(45) Date of Patent: Sep. 23, 2003

(54) DAMASCENE-TYPE INTERCONNECTION STRUCTURE AND ITS PRODUCTION PROCESS

(75) Inventor: Gérard Passemard, Lumbin (FR)

(73) Assignee: STMicroelectronics S.A., Gentilly (FR)

(*) Notice: Subject to any disclaimer, the term of this patent is extended or adjusted under 35 U.S.C. 154(b) by 70 days.

(21) Appl. No.: 09/731,090

(22) Filed: Dec. 6, 2000

(65) Prior Publication Data

US 2001/0004550 A1 Jun. 21, 2001

(30) Foreign Application Priority Data

Dec. 13, 1999 (FR) .............................. 99 15669

(51) Int. Cl.[7] .................. H01L 21/20; H01L 23/58
(52) U.S. Cl. ................ 438/584; 438/637; 438/638; 438/786; 438/778; 257/639; 257/635; 257/636; 257/640
(58) Field of Search ................ 438/584, 624, 438/637, 638, 666, 687, 786, 778, 758, 658, 719, 769, 680, 954, 634, 622, 700, 738; 257/639, 347, 632, 642, 635, 636, 640

(56) References Cited

U.S. PATENT DOCUMENTS 6,159,871 A * 12/2000 Loboda et al. .............. 438/768

6,331,479 B1 * 12/2001 Li et al. ..................... 438/618
6,350,675 B1 * 2/2002 Chooi et al. ................ 438/624
6,372,661 B1 * 4/2002 Lin et al. .................... 438/769

FOREIGN PATENT DOCUMENTS

EP        0960958       12/1999    ........... C23C/16/30

OTHER PUBLICATIONS

Ping et al., *BLOK™ a low–k dielectric barrier/etch stop film for copper damascene applications*, IEEE, May 24, 1999, p. 109–111, XP002129704.

Korczynski et al., Low–k dielectric costs for dual–damascene integration, Solid State Technology, US, Cowan Publ. Corp., Washington, vol. 42, No. 5, May 1999, pp. 43–44, 46, 49, 51, XP000822946.

* cited by examiner

*Primary Examiner*—Matthew Smith
*Assistant Examiner*—Igwe U. Anya
(74) *Attorney, Agent, or Firm*—Lisa K. Jorgenson; Allen, Dyer, Doppelt, Milbrath & Gilchrist, P.A.

(57) ABSTRACT

A interconnection structure of the damascene type is produced on a surface of a microelectronic device that includes at least one dielectric material layer for housing at least one interconnection and at least one interface layer on the dielectric material layer. The interface layer may include at least one SiCH layer and at least one SiOCH layer.

23 Claims, 3 Drawing Sheets

DAMASCENE-TYPE INTERCONNECTION STRUCTURE AND ITS PRODUCTION PROCESS

FIELD OF THE INVENTION

The present invention relates to integrated circuits, and, more particularly, to a damascene-type interconnection structure.

BACKGROUND OF THE INVENTION

The interconnection structures of integrated circuits typically include aluminum doped with copper (Al—Cu), where the doping level is approximately 2 to 4%. The process used for producing these interconnection structures includes depositing the metal, etching the metal to form the interconnection network, and depositing a dielectric thereon for insulating the metal lines both laterally (interline insulation) and vertically (interlevel insulation). This process is commonly involves filling the interline spaces with the dielectric.

In order to improve performance characteristics (e.g., increased speed, lower consumption) it is necessary to use more conductive metals and lower permittivity materials. For metallization purposes, copper (which has a resistivity roughly two times lower than Al—Cu) proves to be a good candidate. Yet, the use of copper may be problematic in a conventional structure because it is very difficult to etch. This is why copper is used in a so-called damascene structure. In a damascene structure, the network of interconnections is formed by etching trenches in a very low permittivity dielectric, depositing a metal nitride barrier layer, and filling the trenches with copper. The excess copper and barrier material are then eliminated by polishing to leave only the dielectric between the metal lines. The production of such a structure requires the use of dielectric material interface layers with hard masks, and copper diffusion barrier or stop layers for mechanochemical polishing (CMP).

Dielectric interface materials such as $SiO_2$, $Si_3N_4$ and $SiO_xN_y$ are conveniently used in damascene structures because they are widely used in the production of integrated circuits. They may be used either in an active zone of the circuits as insulators or at the interconnection level as intermetallic dielectrics or passivation dielectrics. These materials may be deposited by various well known methods, e.g. by thermal oxide growth, low pressure chemical vapor deposition CVD (LPCVD), atmospheric CVD (APCVD), or plasma assisted CVD (PECVD), as will be appreciated by those of skill in the art.

The required properties for dielectric interface materials in damascene structures are as follows. The materials used for the barrier must have a good resistance to the diffusion of copper. The materials used as a hard mask must have good etching selectivity with respect to the underlying materials of the organic or mineral type. Additionally, the materials used as a barrier layer to polishing must have a good resistance to chemo-mechanical polishing in order to permit the elimination of the excess copper above the lines without deterioration of the dielectric. In other words, these materials must have a high polishing selectivity with respect to copper. Furthermore, these materials must also have good electrical strength characteristics, namely a low dielectric constant and low leakage current. Also, the materials deposited directly on the very low permittivity dielectrics (i.e., the materials of the hard masks and barrier layers) must have good chemical compatibility with these dielectrics.

Among the conventional dielectric interface materials, $SiO_2$ has good electrical properties and a good etching selectivity with respect to organic materials. Even so, its properties are inadequate in other respects. $Si_3N_4$ has a good etching selectivity, a good abrasion resistance, and a good resistance to the diffusion of copper, but its dielectric constant is high. SiON provides intermediate characteristics between those of $Si_3N_4$ and $SiO_2$. Thus, none of these conventional materials exhibits all the desired properties.

In addition, certain of these dielectric interface materials deposited by PECVD, for example, from oxidizing gases (e.g., $O_2$, $N_2O$, $NO_2$, $O_3$) can induce an oxidation of the interface or the entire matrix of the low permittivity material. As a result, properties such as dielectric constant, leakage current, densification with thickness modification, adhesion loss and chemical modification may deteriorate. Dielectric materials with a very low permittivity based on Si—O, a porous structure, and having carbon radicals (of the Si—R type) or hydrides (of the Si—H type) are particularly affected by these deteriorations. Thus, for such materials, during the deposition of the dielectric interface material layer there is an oxidation of a depth varying as a function of the porosity thereof. This oxidation induces the formation of silanol (Si—OH) and water, which are respectively very polar radicals or molecules.

Accordingly, finding dielectric materials for use in producing interface layers that satisfy the above-noted properties is problematic.

SUMMARY OF THE INVENTION

The invention makes it possible to produce structures of the damascene type using dielectrics having a very low permittivity of the Si—O based mineral type having a porous structure. These very low permittivity dielectrics incorporate organic radicals (e.g. Si—$CH_3$) or hydrides (e.g. Si—H). The dielectrics may be xerogels, aerogels of methyl or silsesquioxane hydrogen, or any other material based on a porous mineral oxide which can incorporate organic radicals obtained by the spreading of a precursor or by a CVD process. The dielectric interface layers are formed by a combination of SiOCH and SiCH layers or sublayers.

According to the invention, a method for making a damascene-type interconnection structure adjacent a surface of a microelectronic device includes depositing a first dielectric material layer adjacent the surface and depositing a first dielectric material interface layer on the dielectric material layer. The first dielectric material interface layer is deposited by depositing a first SiCH layer on the dielectric layer and depositing a first SiOCH layer on the SiCH layer. At least one interconnection is formed within the first dielectric material layer to contact the surface, and the first dielectric material layer provides a housing for the at least one interconnection.

The first dielectric material layer may include a very low permittivity dielectric material of a mineral type based on Si—O and having at least one of an organic radical or a hydride. The method may also include depositing a second dielectric material layer on the first dielectric material interface layer and depositing a second dielectric material interface layer on the second dielectric layer. The second dielectric material interface layer may be deposited by depositing a second SiCH layer on the second dielectric material layer and depositing a second SiOCH layer on the second SiCH layer. Depositing the second dielectric material interface layer may also include depositing a third SiCH layer on the second SiOCH layer.

Forming the at least one interconnection may include forming at least one copper interconnection, and a metal layer may be deposited adjacent the first dielectric material layer prior to forming the at least one copper interconnection to reduce diffusion of copper into the first dielectric material layer. The microelectronic device may be formed on a silicon substrate, for example. Furthermore, forming the at least one interconnection may include etching at least one hole in the first SiOCH layer, etching portions of the first SiCH layer, the first dielectric material interface layer, and the first dielectric material layer beneath the at least one hole using the first SiOCH layer as an etching mask to thereby form at least one trench. Copper may then be deposited within the at least one trench to thereby form the at least one interconnection. A barrier layer may be deposited in the trench prior to depositing the copper to reduce diffusion of the copper into the first dielectric material layer.

According to an alternative embodiment, a method for making a dual damascene-type interconnection structure on a surface of a semiconductor substrate to provide at least one interconnection with at least one conductive line formed in the semiconductor substrate is also provided. The method may include depositing a first dielectric material layer having a very low permittivity on the surface and depositing a first interface layer on the first dielectric material layer. At least one hole may be etched in the first interface layer to expose at least one portion of the first dielectric material layer. A second dielectric material layer having a very low permittivity may be deposited on the first interface layer and the at least one exposed portion of the first dielectric material layer.

A second interface layer may be deposited on the second dielectric material layer, and at least one hole may be etched in the second interface layer and the first dielectric material layer therebeneath to thereby form at least one trench exposing the at least one copper line. The first and second interface layers thereby provide hard masks for etching the first and second dielectric material layers. Also, a layer of a first metal may be deposited in the trench, and a second metal may be deposited thereon to form the interconnection with the at least one copper line. The layer of the first metal reduces diffusion of the second metal into the first and second dielectric material layers and the first and second interface layers. The first and second dielectric material layers thus form a housing for the at least one interconnection.

The at least one conductive line may include the second metal, and a barrier layer may be deposited on the substrate prior to depositing the first dielectric material layer to prevent diffusion of the second metal from the at least one conductive line into the first dielectric material layer. Depositing the first interface layer may include depositing an SiCH layer on the dielectric material layer and depositing an SiOCH layer on the SiCH layer. Additionally, etching the at least one hole in the first interface layer may include depositing a resin mask on the SiOCH layer, etching at least one hole in the SiOCH layer using the resin mask to expose at least one portion of the SiCH layer, removing the resin mask, and etching the at least one exposed portion of the SiCH layer to the thereby expose the at least one portion of the first dielectric material layer.

Depositing the second interface layer may include depositing a first SiCH layer on the second dielectric material layer, depositing an SiOCH layer on the SiCH layer, and depositing a second SiCH layer on the SiOCH layer. Etching the at least one hole in the second interface layer and the first dielectric material layer therebeneath may include depositing a resin mask adjacent the second SiCH layer, etching at least one hole in the second SiCH layer using the resin mask to expose at least one portion of the SiOCH layer, removing the resin mask, and etching the at least one exposed portion of the second SiOCH layer and corresponding portions of the first SiCH layer, the second dielectric material layer, and the first dielectric material layer therebeneath to thereby form the at least one trench. Furthermore, the third SiCH layer may be removed after completing the etching steps.

The method may further include polishing the second interface layer after depositing the layer of the first metal layer and depositing the second metal to thereby remove any excess metal therefrom. Also, the conductive line and the second metal may include copper.

A damascene-type interconnection structure according to the present invention on a surface of a microelectronic device includes a first dielectric material layer on the surface and a first dielectric material interface layer on the first dielectric material layer. The first dielectric material interface layer may include a first SiCH layer on the first dielectric layer and a first SiOCH layer on the first SiOCH layer. The interconnection structure also includes at least one interconnection within the first dielectric material and in contact with the surface of the microelectronic device.

The first dielectric material layer may include a very low permittivity dielectric material of a mineral type based on Si—O and having at least one of an organic radical or a hydride. A second dielectric material layer may be included on the first dielectric material interface which includes a second SiCH layer on the first dielectric material interface layer and a second SiOCH layer on the second SiCH layer. The microelectronic device may be formed on a silicon substrate, and the at least one interconnection may include copper. Furthermore, a barrier may be included between the surface and the first dielectric material layer to reduce diffusion of copper from the at least one interconnection into the first dielectric material layer.

A dual damascene-type interconnection structure according to another embodiment of the present invention is also provided. The dual damascene-type interconnection structure is on a surface of a microelectronic device formed on a silicon substrate, and the surface includes at least one copper line for connection to the interconnection structure. The double damascene-type interconnection structure may include a first barrier layer on the surface to reduce diffusion of copper from the at least one copper line and a first dielectric material layer having a very low permittivity on the barrier layer. Furthermore, a first interface layer is included on the first dielectric material layer including a first SiCH layer on the first dielectric material layer and a first SiOCH layer on the first SiCH layer. A second dielectric material layer having a very high permittivity may be included on the first interface layer. A second interface layer on the second dielectric material layer may include a second SiCH layer on the second dielectric material layer and a second SiOCH layer on the second SiCH layer. At least one copper interconnection may be included within the structure and electrically connected to the at least one copper line. Also, a second barrier layer separating the at least one copper interconnection and the first and second dielectric material layers may be included to prevent diffusion of copper therein.

BRIEF DESCRIPTION OF THE DRAWINGS

The invention will be better understood and other advantages and features will become apparent from the following

DETAILED DESCRIPTION OF THE PREFERRED EMBODIMENTS

As noted above, the combination of SiOCH and SiCH layer or sublayers according to the present invention provides the desired qualities for producing a good interface layer. The following table compares SiCH and SiOCH with other dielectric materials currently used in microelectronics. The symbols + and − and their number respectively indicate the more or less satisfactory properties. The last line in the table relates to the chemical compatibility between each material in the table and the dielectric materials for housing the interconnections.

| | Materials | | | | |
|---|---|---|---|---|---|
| Properties | $SiO_2$ | $Si_3N_4$ | SiON | SiCH | SiOCH |
| Dielectric constant | 4.3 | 8 | 6.5 | 5.5 | 2.7 |
| Fluorine/$SiO_2$ etching selectivity | 0 | ++ | + | +++ | + |
| Resistance to abrasion/Cu | + | ++ | + | +++ | ++ |
| Cu diffusion | − | ++ | − | +++ | − |
| Chemical compatibility | −−− | + | − | + | −− |

The above table illustrates that SiCH and SiOCH together have qualities which are desirable for producing a good interface layer, i.e., resistance to abrasion and copper diffusion, etching selectivity for SiCH, and a low dielectric constant for SiOCH. In addition, SiCH is produced without any oxidizing precursor. These two materials have a good mutual compatibility and can be deposited in the same reactor from equivalent precursors of the methyl, dimethyl, trimethyl or phenyl silane types. SiOCH is obtained by adding an oxidizing precursor of the $O_2$, $N_2O$, $NO_2$ or $CO_2$ type.

Figure 1:
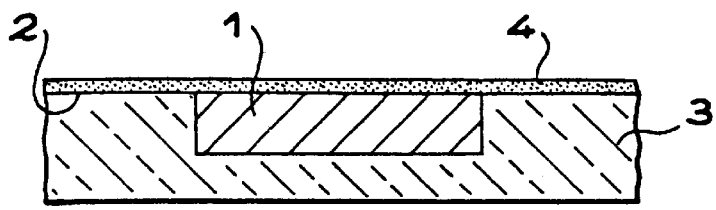
Figure 2:
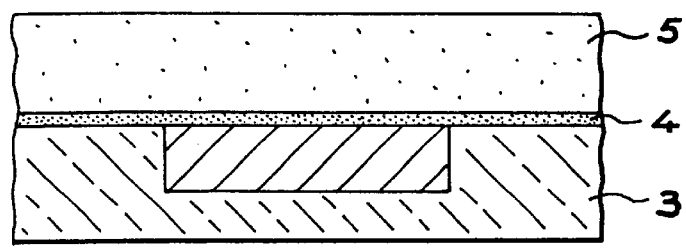

An example of the production of a double damascene structure will be now be described with reference to FIGS. 1 through 10, which are partial, cross-sectional views of a double damascene interconnection structure according to the present invention. As seen in FIG. 1, a copper line 1 is flush with a surface 2 of a dielectric 3 deposited on a semiconductor substrate (not shown). An interface layer 4 is deposited on the surface 2 and serves as a barrier layer to the diffusion of copper. The thickness of the layer 4 may be between 10 and 30 nm, for example. A very low permittivity dielectric material layer 5 known as a dielectric via is then deposited on the layer 4 and has a thickness between 0.5 and 1 um, for example, as seen in FIG. 2.

Figure 3:
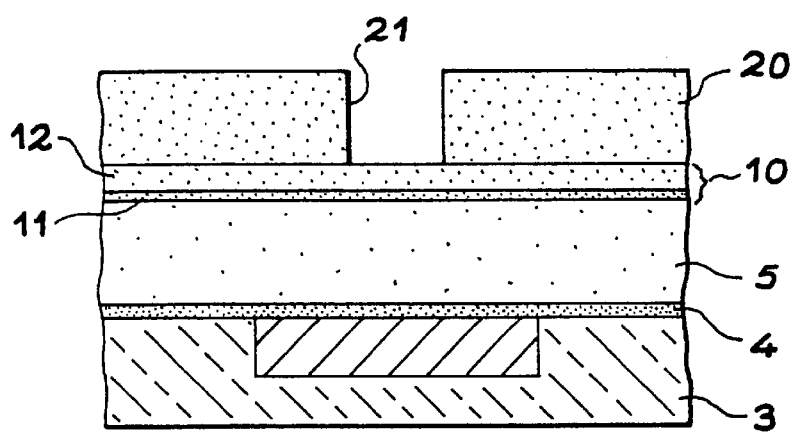

An interface layer 10 is then deposited on the dielectric material layer 5, as shown in FIG. 3. The interface layer 10 is used for forming a hard mask and includes a SiCH sublayer 11 deposited on the dielectric material layer 5 and a SiOCH sublayer 12 deposited on the SiCH sublayer 11. The sublayer 11 may have a thickness in a range of about 10 and 20 nm, whereas the thickness of the sublayer 12 may be about 100 nm, for example. This sublayer stack is compatible with the low permittivity material of the layer 5 because SiCH does not oxidize the dielectric and ensures an excellent etching selectivity. That is, it provides a hard mask/low permittivity dielectric.

Figure 4:
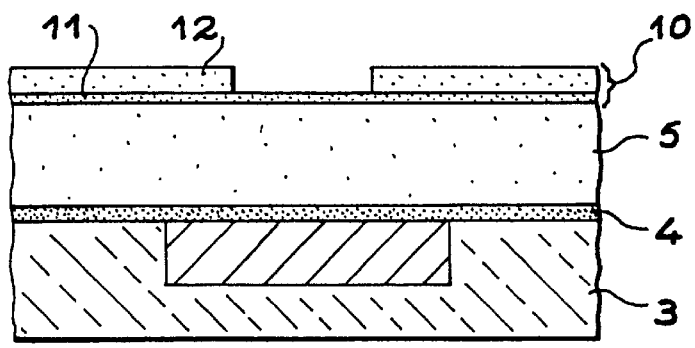

In order to subsequently permit an electrical connection with the line, a photosensitive resin layer 20 is deposited on the interface layer or hard mask 10 and an etching hole 21 is defined therein over the line 1. The etching of the hard mask 10 takes place in three steps. First, a hole is etched in the SiOCH sublayer 1 until the SiCH sublayer 11 is revealed. The resin layer 20 is then removed and the dielectric via layer 5, which is very sensitive to the oxidation produced by the resin removal oxidizing agents ($O_2$ plasma, organic bases, etc.), is protected by the sublayer 11, as seen in FIG. 4. Finally, the sublayer 11 is etched using the sublayer 12 as a mask.

Figure 5:
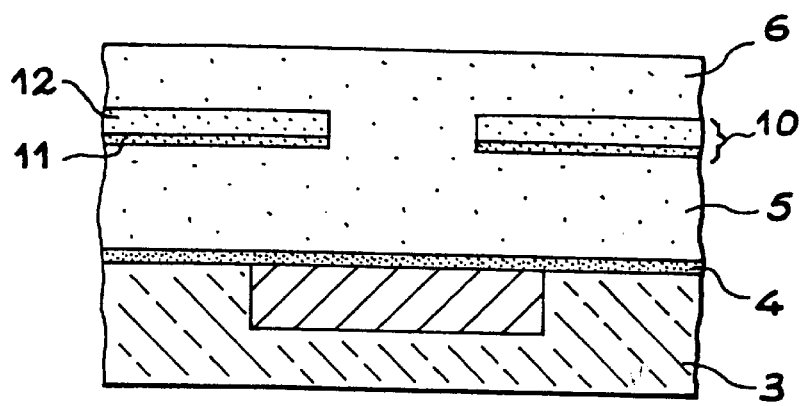
Figure 6:
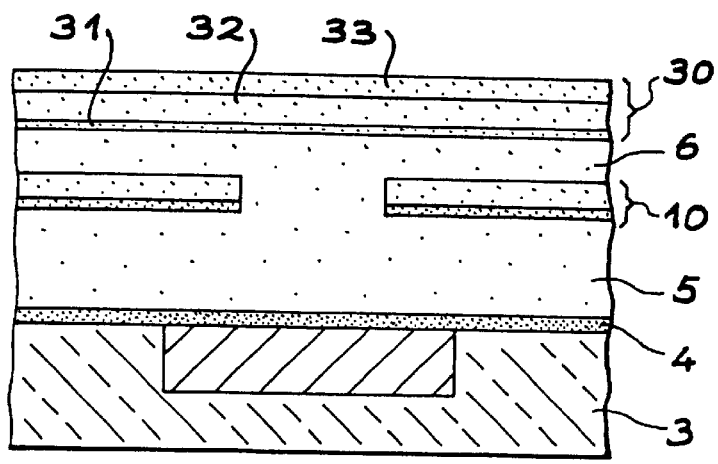

As may be seen in FIG. 5, a very low permittivity dielectric material layer 6 called the "line dielectric" is deposited on the interface layer 10 and fills the hole made in the layer 10. The thickness of the layer 6 may be in a range of about 0.3 to 0.6 μm, for example. An interface layer 30 is then deposited on the dielectric material layer 6, as shown in FIG. 6. The interface layer 30 includes three sublayers, namely (in the order of deposition): a SiCH sublayer 31 having a thickness below about 10 nm, for example, and compatible with the dielectric material of the layer 6; a SiOCH sublayer 32 having a thickness in a range of about 100 and 150 nm, for example; and a SiCH sublayer 33 preferably having a thickness slightly greater than the sum of the thicknesses of layer 2 and SiCH sublayer 31.

The interface layer 30 serves as a stop or barrier layer to a chemo-mechanical polishing (CMP) and also as a hard mask. The sublayer 31 serves to reduce the oxidation of the dielectric layer 6. Sublayer 32 acts as a polishing stop layer, i.e., it protects the dielectric layer 6 from polishing uniformity defects. Furthermore, the sublayer 32 limits the effects of copper removal during the CMP step. The sublayer 33 serves as an etching countermask making it possible to etch in a single step a hole revealing the line 1.

Figure 7:
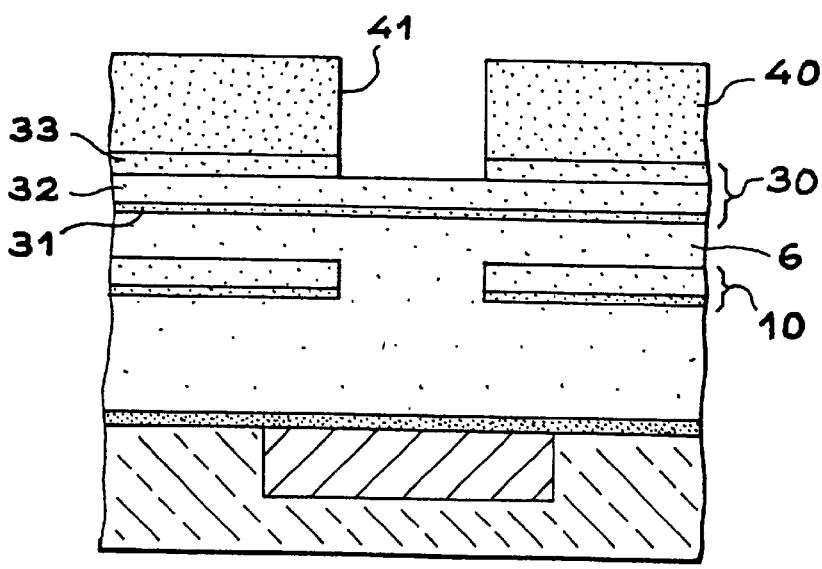
Figure 8:
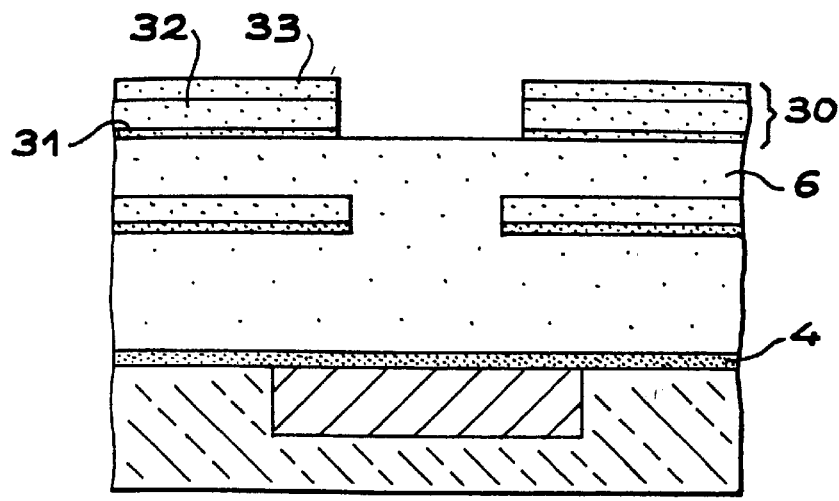

As shown in FIG. 7, a photosensitive resin layer 40 is deposited on the interface layer 30, and an etching hole 41 is defined therein above the hole previously etched in the hard mask 10. A hole is first etched in the SiCH sublayer 33 with the SiOCH sublayer 32 serving as a stop or barrier. The resin is then removed and the dielectric material of layer 6 is protected by the sublayers 31 and 32. The etching of the hard mask 30 continues until the line dielectric layer 6 is revealed, as shown in FIG. 8. The SiCH sublayer 33 is etched over its entire surface to a thickness which is preferably at least equivalent to the thickness of the SiCH sublayer 31.

Figure 9:
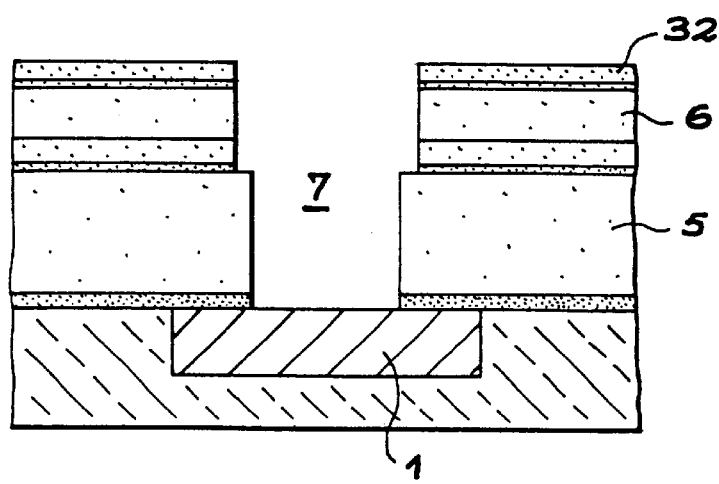

The low permittivity dielectric material of the layers 5 and 6 is then etched through the holes made in the hard masks 10 and 30 until the SiCH layer 4, which serves as a copper diffusion barrier layer, is reached. The remainder of the SiCH sublayer 33 and the SiCH layer 4 at the bottom of the etched hole or trench 7 are then simultaneously etched and the line 1 is revealed, as shown in FIG. 9.

Figure 10:
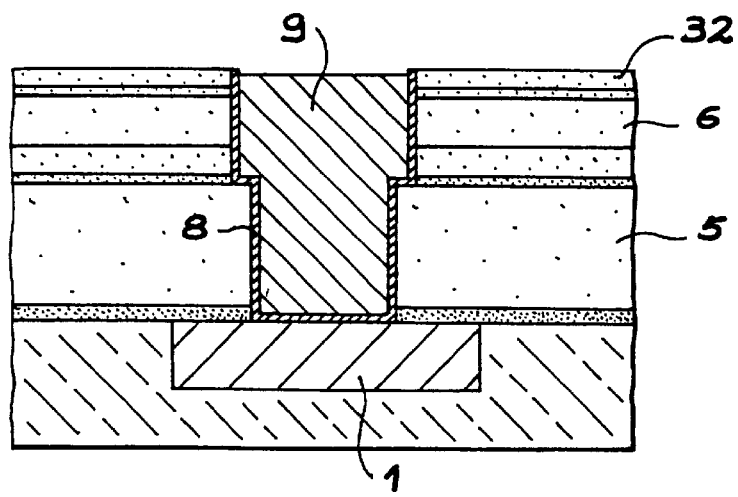

A titanium nitride or tantalum nitride layer 8 is uniformly deposited on the structure and serves as a metal diffusion barrier, as seen in FIG. 10. This layer also adheres to the walls and bottom of the hole 7, which is then filled with copper. The excess metal barrier and copper are then polished using the SiOCH sublayer 32 as a stop or barrier. A copper connection 9 is thus exposed traversing the via dielectric layer 5 and the line dielectric layer 6 to make contact with the line 1.

The following example will illustrate the advantages of the structure according to the invention. For a layer 6 (line dielectric) having a thickness of about 0.4 um and a dielectric constant of about 2, an SiCH barrier sublayer 31 having a thickness of about 5 nm, and an SiOCH sublayer 32 having a thickness of about 50 nm, the dielectric constant equivalent for this stack is about 2.25. By way of comparison, the use of SiN in place of SiCH and the use of $SiO_2$ in place of SiOCH would lead to an equivalent dielectric constant of about 2.55.

That which is claimed is:

1. A method for making a damascene-type interconnection structure adjacent a substrate, the method comprising:
    depositing a first dielectric material layer adjacent the substrate;
    depositing a first dielectric material interface layer on the dielectric material layer by
        depositing a first SiCH layer on the dielectric layer, and
        depositing a first SiOCH layer on the SiCH layer; and
    forming at least one interconnection within the first dielectric material layer so that the first dielectric material layer provides a housing for the at least one interconnection.

2. The method of claim 1 wherein the first dielectric material layer comprises a low permittivity dielectric material based on Si—O and comprising at least one of an organic radical or a hydride.

3. The method of claim 1 further comprising:
    depositing a second dielectric material layer on the first dielectric material interface layer; and
    depositing a second dielectric material interface layer on the second dielectric layer by
        depositing a second SiCH layer on the second dielectric material layer, and
        depositing a second SiOCH layer on the second SiCH layer.

4. The method of claim 3 wherein depositing the second dielectric material interface layer further comprises depositing a third SiCH layer on the second SiOCH layer.

5. The method of claim 1 wherein forming the at least one interconnection comprises forming at least one copper interconnection; and wherein the method further comprises depositing a barrier layer adjacent the first dielectric material layer prior to forming the at least one copper interconnection to reduce diffusion of copper into the first dielectric material layer.

6. The method of claim 1 wherein the substrate comprises a silicon substrate.

7. The method of claim 1 wherein forming the at least one interconnection comprises:
    etching at least one hole in the first SiOCH layer;
    etching portions of the first SiCH layer, the first dielectric material interface layer, and the first dielectric material layer beneath the at least one hole using the first SiOCH layer as an etching mask to thereby form at least one trench; and
    depositing copper within the at least one trench to thereby form the at least one interconnection.

8. The method of claim 7 further comprising depositing a barrier layer in the trench prior to depositing the copper to reduce diffusion of the copper into the first dielectric material layer.

9. A method for making a dual damascene-type interconnection structure adjacent a semiconductor substrate to provide at least one interconnection with at least one conductive line formed in the substrate, the method comprising:
    deposting a first dielectric material layer having a low permittivity on the substrate;
    depositing a first interface layer on the first dielectric material layer by depositing an SiCH layer on the dielectric material layer and depositing an SiOCH layer on the SiCH layer;
    etching at least one hole in the first interface layer to expose at least one portion of the first dielectric material layer;
    depositing a second dielectric material layer having a low permittivity on the first interface layer and the at least one exposed portion of the first dielectric material layer;
    depositing a second interface layer on the second dielectric material layer;
    etching at least one hole in the second interface layer and the first dielectric material layer therebeneath to thereby form at least one trench exposing the at least one conductive line, the first and second interface layers providing hard masks for etching the first and second dielectric material layers;
    depositing a layer of the first metal in the trench; and
    depositing a second metal within the trench to thereby form the at least one interconnection with the at least one conductive line, the layer of the first metal reducing diffusion of the second metal into the first and second dielectric material layers and the first and second interface layers, and the first and second dielectric material layers forming a housing for the at least one interconnection.

10. The method of claim 9 wherein the at least one conductive line comprises the second metal; and wherein the method further comprises depositing a barrier layer on the substrate prior to depositing the first dielectric material layer to prevent diffusion of the second metal from the at least one conductive line into the first dielectric material layer.

11. The method of claim 9 wherein etching the at least one hole in the first interface layer comprises;
    depositing a resin mask on the SiOCH layer;
    etching at least one hole in the SiOCH layer using the resin mask to expose at least one portion of the SiCH layer;
    removing the resin mask; and
    etching the at least one exposed portion of the SiCH layer to the thereby expose the at least one portion of the first dielectric material layer.

12. The method of claim 9 wherein depositing the second interface layer comprises:
    depositing a first SiCH layer on the second dielectric material layer;
    depositing an SiOCH layer on the SiCH layer; and
    depositing a second SiCH layer on the SiOCH layer.

13. The method of claim 12 wherein etching the at least one hole in the second interface layer and the first dielectric material layer therebeneath comprises:
    depositing a resin mask adjacent the second SiCH layer;
    etching at least one hole in the second SiCH layer using the resin mask to expose at least one portion of the SiOCH layer;
    removing the resin mask; and
    etching the at least one exposed portion of the second SiOCH layer and corresponding portions of the first SiCH layer, the second dielectric material layer, and the first dielectric material layer therebeneath to thereby form the at least one trench.

14. The method of claim 12 further comprising removing the third SiCH layer after completing the etching steps.

15. The method of claim 9 further comprising polishing the second interface layer after depositing the layer of the first metal layer and depositing the second metal to thereby remove any excess metal therefrom.

16. The method of claim 9 wherein the conductive line and the second metal comprise copper.

17. A microelectronic device comprising:
   a substrate;
   a first dielectric material layer on the substrate;
   a first dielectric material interface layer on said first dieletric material layer and comprising
      a first SiCH layer on said first dielectric layer, and
      a first SiOCH layer on said first SiOCH layer; and
   at least one interconnection within said first dielectric material and in contact with the substrate.

18. The microelectronic device of claim 17 wherein said first dielectric material layer comprises a low permittivity dielectric material based on Si—O and comprising at least one of an organic radical or a hydride.

19. The microelectronic device of claim 17 further comprising a second dielectric material layer on said first dielectric material interface comprising:
   a second SiCH layer on said first dielectric material interface layer; and
   a second SiOCH layer on said second SiCH layer.

20. The microelectronic device of claim 17 wherein said substrate comprises silicon.

21. The microelectronic device of claim 17 wherein said at least one interconnection comprises copper; and further comprising a barrier between said substrate and said first dielectric material layer to reduce diffusion of copper from said at least one interconnection into said first dielectric material layer.

22. A microelectronic device comprising:
   a silicon substrate;
   at least one copper line within said substrate;
   a first barrier layer on said substrate to reduce diffusion of copper from said at least one copper line;
   a first dielectric material layer having a low permittivity on said first barrier layer;
   a first interface layer on said first dielectric material layer comprising
      a first SiCH layer on said first dielectric material layer, and
      a first SiOCH layer on said first SiCH layer;
   a second dielectric material layer having a high permittivity on said first interface layer;
   a second interface layer on said second dielectric material layer comprising
      a second SiCH layer on said second dielectric material layer, and
      a second SiOCH layer on said second SiCH layer;
   at least one copper interconnection within said first and second dielectric material layers and electrically connected to said at least one copper line; and
   a second barrier layer separating said at least one copper interconnection and said first and second dielectric material layers to prevent diffusion of copper therein.

23. The microelectronic device of claim 22 wherein said first dielectric material layer comprises a low permittivity dielectric material based on Si—O and comprising at least one of an organic radical or a hydride.

* * * * *